(12) United States Patent
Lane et al.

(10) Patent No.: US 11,296,049 B1
(45) Date of Patent: Apr. 5, 2022

(54) PROCESSING OVEN

(71) Applicant: Yield Engineering Systems, Inc., Fremont, CA (US)

(72) Inventors: Christopher Lane, Los Gatos, CA (US); Eli Vronsky, Los Altos, CA (US); Taylor Nguyen, Milpitas, CA (US); Ronald R Stevens, Pleasanton, CA (US); Gabriel Ormonde, Lathrop, CA (US); Jed Hsu, Fremont, CA (US)

(73) Assignee: YIELD ENGINEERING SYSTEMS, INC., Fremont, CA (US)

( * ) Notice: Subject to any disclaimer, the term of this patent is extended or adjusted under 35 U.S.C. 154(b) by 0 days.

(21) Appl. No.: 17/463,012

(22) Filed: Aug. 31, 2021

(51) Int. Cl.
*H01L 23/00* (2006.01)
*B23K 1/008* (2006.01)
*B23K 37/04* (2006.01)
*B23K 101/40* (2006.01)

(52) U.S. Cl.
CPC .............. *H01L 24/75* (2013.01); *B23K 1/008* (2013.01); *B23K 37/0452* (2013.01); *H01L 24/11* (2013.01); *B23K 2101/40* (2018.08); *H01L 24/74* (2013.01); *H01L 2224/11849* (2013.01); *H01L 2224/759* (2013.01); *H01L 2224/7565* (2013.01); *H01L 2224/75252* (2013.01); *H01L 2224/75272* (2013.01); *H01L 2224/75283* (2013.01); *H01L 2224/75501* (2013.01); *H01L 2224/75802* (2013.01)

(58) Field of Classification Search
CPC .......... H01L 24/75; H01L 2224/75272; H01L 2224/75283; H01L 2224/75101; H01L 2224/755; B23K 1/0016; B23K 1/008
See application file for complete search history.

*Primary Examiner* — David A Zarneke
(74) *Attorney, Agent, or Firm* — Finnegan, Henderson, Farabow, Garrett & Dunner, LLP (57) ABSTRACT

A solder reflow oven includes a processing chamber that defines an enclosure. The enclosure includes a spindle configured to support a substrate and rotate the substrate about a central axis of the processing chamber. The spindle is also configured to move vertically along the central axis and position the substrate at different locations within the enclosure. The oven further includes a chemical delivery tube configured to direct a chemical vapor into the enclosure, a lamp assembly configured to heat a top surface of the substrate, and a lift assembly configured to move the spindle along the central axis.

22 Claims, 11 Drawing Sheets

PROCESSING OVEN

TECHNICAL FIELD

The present disclosure relates to a solder reflow oven.

BACKGROUND

The electronics industry has continued to engineer greater functionality into smaller electronic devices at lower cost. This drive towards smaller and less expensive electronic devices has driven the development of advanced semiconductor packaging technologies. For example, wire bonds conventionally used to attach a die to a substrate, have been replaced by solder bumps. Flip chip, also known as controlled collapse chip connection (abbreviated as C4), is one such method of connecting semiconductor dies (or IC chips) to a substrate with solder bumps deposited on the I/O (input/output) pads of the dies on the top side of the wafer before the wafer is diced into individual dies. After the wafer is diced into individual dies, the die is flipped so that its top side faces down and aligned so that its pads align with matching pads on the substrate. The solder is reflowed to complete the interconnect.

Conventionally, solder reflow is accomplished by passing the assembly through a batch reflow oven in which the assembly passes through different zones of the oven on a conveyor belt. The zones heat and cool the wafers and introduce chemical vapor to the wafers at atmospheric pressure. Yet, introducing chemical vapor for solder reflow at atmospheric pressure is not optimal for solder geometries of less than about 50 µm (microns). Atmospheric pressure may provide a competing force to the chemical vapor pressure and hinder the vapor from reaching all regions of the solder bumps. As a result, solder yield is reduced. Typical solder failure mechanisms observed during reflow include voids, non-wetted joints, non-contact opens, bridging, and shorts. As semiconductor technology advances, the solder bumps on dies are becoming too small for batch thermal reflow systems to achieve high solder yield. Rather, smaller bumps on dies require more precise thermal process control and chemical vapor delivery to enable reflow with high yield. The solder reflow ovens of the current disclosure may alleviate one or more of the above-described issues.

SUMMARY

Several embodiments of a solder reflow oven (or a processing oven) and methods of using the oven are disclosed. It is to be understood that both the foregoing general description and the following detailed description are exemplary and explanatory only. As such, the scope of the disclosure is not limited solely to the disclosed embodiments. Instead, it is intended to cover such alternatives, modifications and equivalents within the spirit and scope of the disclosed embodiments. Persons skilled in the art would understand how various changes, substitutions and alterations can be made to the disclosed embodiments without departing from the spirit and scope of the disclosure.

In one aspect, a solder reflow oven is disclosed. The oven may include a processing chamber that defines an enclosure. The enclosure may include a spindle configured to support a substrate and rotate with the substrate about a central axis of the processing chamber. The spindle may also be configured to move vertically along the central axis to position the substrate at different locations within the enclosure. The oven may further include a lamp assembly configured to heat a top surface of the substrate supported on the spindle, and a lift assembly configured to move the spindle along the central axis.

Various embodiments of the oven may alternatively or additionally include one or more of the following features: the processing chamber may further comprise a transparent window that defines a top wall of the enclosure and the lamp assembly may be configured to heat the top surface of the substrate through the transparent window; the processing chamber may further comprise a cold plate that defines a bottom wall of the enclosure and the cold plate may comprise one or more channels configured to direct a liquid coolant therethrough; the processing chamber may further comprise a lid and the lamp assembly may be disposed on an underside of the lid; the spindle may further comprise one or more thermocouples configured to contact a surface of the substrate; a side wall of the processing chamber may further comprise a substrate-inlet port configured to direct the substrate into the enclosure; a bottom region of the enclosure may further comprise a plurality of gas-inlet ports configured to direct an inert gas into the enclosure and a top region of the enclosure may include a chemical delivery tube configured to direct a chemical vapor into the enclosure; the chemical delivery tube may further comprise a plurality of gas nozzles configured to direct the chemical vapor toward the top surface of the substrate; the chemical delivery tube may comprise one or more of a straight tube that extends from a side of the enclosure toward the central axis, a tube that includes one or more angled portions, or a T-shaped tube; the oven may further comprise a control system configured to control the operation of the lamp assembly using a feedback loop based on a temperature of the substrate; and the processing chamber may further comprise a vacuum port configured to be coupled to a vacuum pump.

In another aspect, a solder reflow oven is disclosed. The oven may include a processing chamber that defines an enclosure. The processing chamber may include a spindle positioned in the enclosure and configured to support a substrate thereon and rotate along with the substrate about a central axis of the processing chamber. The spindle may also be configured to move vertically along the central axis to position the substrate at different locations within the enclosure. The processing chamber may also include a cold plate that forms a bottom wall of the enclosure. The cold plate may include one or more channels configured to direct a liquid coolant therethrough. A plurality of gas-inlet ports may be positioned at a bottom region of the enclosure and a chemical delivery tube may be positioned at a top region of the enclosure. The plurality of gas-inlet ports may be configured to direct gas (e.g., an inert gas, such as nitrogen, etc.) into the enclosure and the chemical delivery tube may be configured to direct a chemical vapor (e.g., formic acid, etc.) into the enclosure. The oven may also include a lamp assembly configured to heat a top surface of the substrate supported on the spindle. The lamp assembly may include a plurality of spaced-apart lamps. A spacing of adjacent lamps of the lamp assembly may be closer at sides of the lamp assembly than at a center of the lamp assembly.

Various embodiments of the oven may alternatively or additionally include one or more of the following features: the chemical delivery tube may further comprise a plurality of gas nozzles configured to direct the chemical vapor toward the top surface of the substrate; the processing chamber may further comprise a lid and the lamp assembly may be disposed on an underside of the lid; the spindle may further comprise one or more thermocouples configured to contact a surface of the substrate; and a side wall of the processing chamber may further comprise a substrate-inlet port and the substrate-inlet port may be configured to direct the substrate into the enclosure.

In a further embodiment, a solder reflow oven is disclosed. The oven may include a processing chamber having a lid. The processing chamber and the lid may define an enclosure. A substrate-support structure may be positioned in the enclosure. The substrate-support structure may be configured to support a substrate, and rotate with the substrate about a central axis of the processing chamber. A lamp assembly may be positioned on an underside of the lid. The lamp assembly may be configured to heat a top surface of the substrate positioned in the enclosure. The lamp assembly may include a plurality of lamps spaced apart from each other such that a spacing of adjacent lamps of the lamp assembly is smaller at sides of the lamp assembly than at a center of the lamp assembly. A chemical delivery tube may also be positioned in the enclosure. The chemical delivery tube may include a plurality of gas nozzles configured to direct a chemical vapor toward the top surface of the substrate positioned in the enclosure.

Various embodiments of the oven may alternatively or additionally include one or more of the following features: the processing chamber may further comprise a cold plate that defines a bottom wall of the enclosure and the cold plate may comprise one or more channels configured to direct a liquid coolant therethrough; the spacing between adjacent lamps at the sides of the lamp assembly 80 may be between about 10-60 mm and the spacing between adjacent lamps at the center of the lamp assembly may be between about 40-80 mm; the plurality of gas nozzles of the chemical delivery tube may be configured to direct formic acid vapor toward the top surface of the substrate positioned in the enclosure; and the processing chamber may include a plurality of gas-inlet ports configured to direct an inert gas into the enclosure below the substrate positioned in the enclosure.

In yet another aspect, a method of using a solder reflow oven is disclosed. The method may include supporting a substrate on a rotatable spindle in an enclosure of the processing chamber and rotating the spindle with the substrate supported thereon. The method may also include raising the spindle with the substrate to a heating zone of the enclosure located at a top region of the enclosure, activating a lamp assembly of the oven to heat a top surface of the substrate, and lowering the spindle with the substrate to a dosing zone of the enclosure located below the heating zone. The lamp assembly may include a plurality of spaced-apart lamps. A spacing of adjacent lamps of the lamp assembly may be closer at sides of the lamp assembly than at a center of the lamp assembly. The method may also include directing a chemical vapor into the enclosure above the top surface of the substrate, and after directing the chemical vapor, raising the spindle with the substrate to the heating zone to further heat the top surface of the substrate. The method may additionally include, after further heating the top surface of the substrate, lowering the spindle with the substrate to a cooling zone of the enclosure located below the dosing zone to cool the substrate.

Various embodiments of the method may alternatively or additionally include one or more of the following features: directing a chemical vapor into the enclosure may further comprise simultaneously directing nitrogen gas into the enclosure below the substrate; and the substrate may further comprise a solder on the top surface, and heating the top surface of the substrate may include melting the solder.

BRIEF DESCRIPTION OF THE DRAWINGS

The accompanying drawings, which are incorporated in and constitute a part of this disclosure, illustrate exemplary embodiments and, together with the description, are used to explain the disclosed principles. In these drawings, where appropriate, reference numerals illustrating like structures, components, materials, and/or elements in different figures are labeled similarly. It is understood that various combinations of the structures, components, and/or elements, other than those specifically shown, are contemplated and are within the scope of the present disclosure.

For simplicity and clarity of illustration, the figures depict the general structure of the various described embodiments. Details of well-known components or features may be omitted to avoid obscuring other features, since these omitted features are well-known to those of ordinary skill in the art. Further, elements in the figures are not necessarily drawn to scale. The dimensions of some features may be exaggerated relative to other features to improve understanding of the exemplary embodiments. One skilled in the art would appreciate that the features in the figures are not necessarily drawn to scale and, unless indicated otherwise, should not be viewed as representing proportional relationships between different features in a figure. Additionally, even if it is not specifically mentioned, aspects described with reference to one embodiment or figure may also be applicable to, and may be used with, other embodiments or figures.

DETAILED DESCRIPTION

All relative terms such as "about," "substantially," "approximately," etc., indicate a possible variation of ±10% (unless noted otherwise or another variation is specified). For example, a feature disclosed as being about "t" units long (wide, thick, etc.) may vary in length from (t−0.1t) to (t+0.1t) units. Similarly, a temperature within a range of about 100-150° C. can be any temperature between (100−10%) and (150+10%). In some cases, the specification also provides context to some of the relative terms used. For example, a structure described as being substantially circular or substantially cylindrical may deviate slightly (e.g., 10% variation in diameter at different locations, etc.) from being perfectly circular or cylindrical. Further, a range described as varying from, or between, 5 to 10 (5-10), includes the endpoints (i.e., 5 and 10).

Unless otherwise defined, all terms of art, notations, and other scientific terms or terminology used herein have the same meaning as is commonly understood by one of ordinary skill in the art to which this disclosure belongs. Some of the components, structures, and/or processes described or referenced herein are well understood and commonly employed using conventional methodology by those skilled in the art. Therefore, these components, structures, and processes will not be described in detail. All patents, applications, published applications and other publications referred to herein as being incorporated by reference are incorporated by reference in their entirety. If a definition or description set forth in this disclosure is contrary to, or otherwise inconsistent with, a definition and/or description in these references, the definition and/or description set forth in this disclosure controls over those in the references that are incorporated by reference. None of the references described or referenced herein is admitted as prior art to the current disclosure.

Figure 1A:
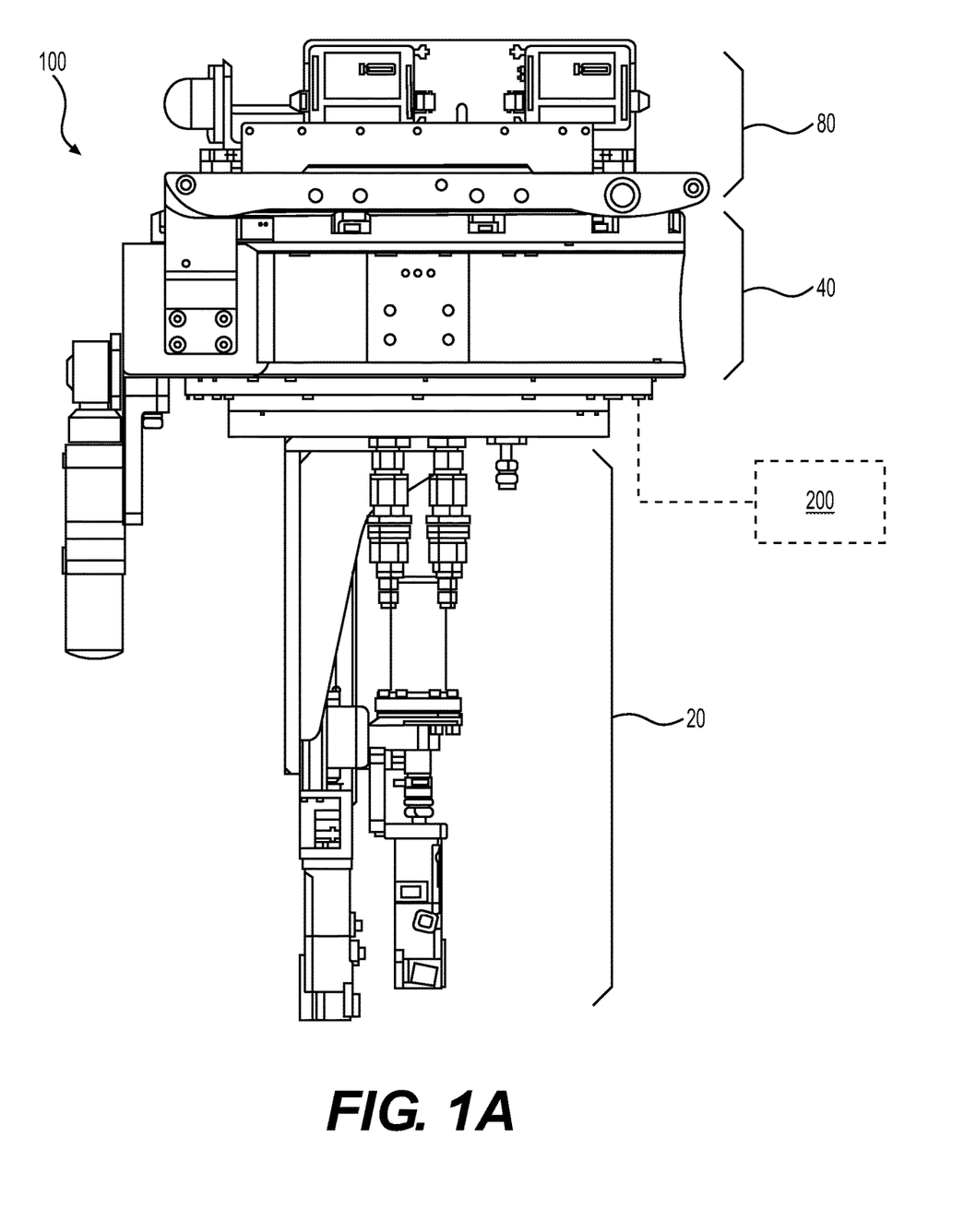
FIGS. 1A and 1B illustrate an exemplary processing oven of the current disclosure.
Figure 1B:
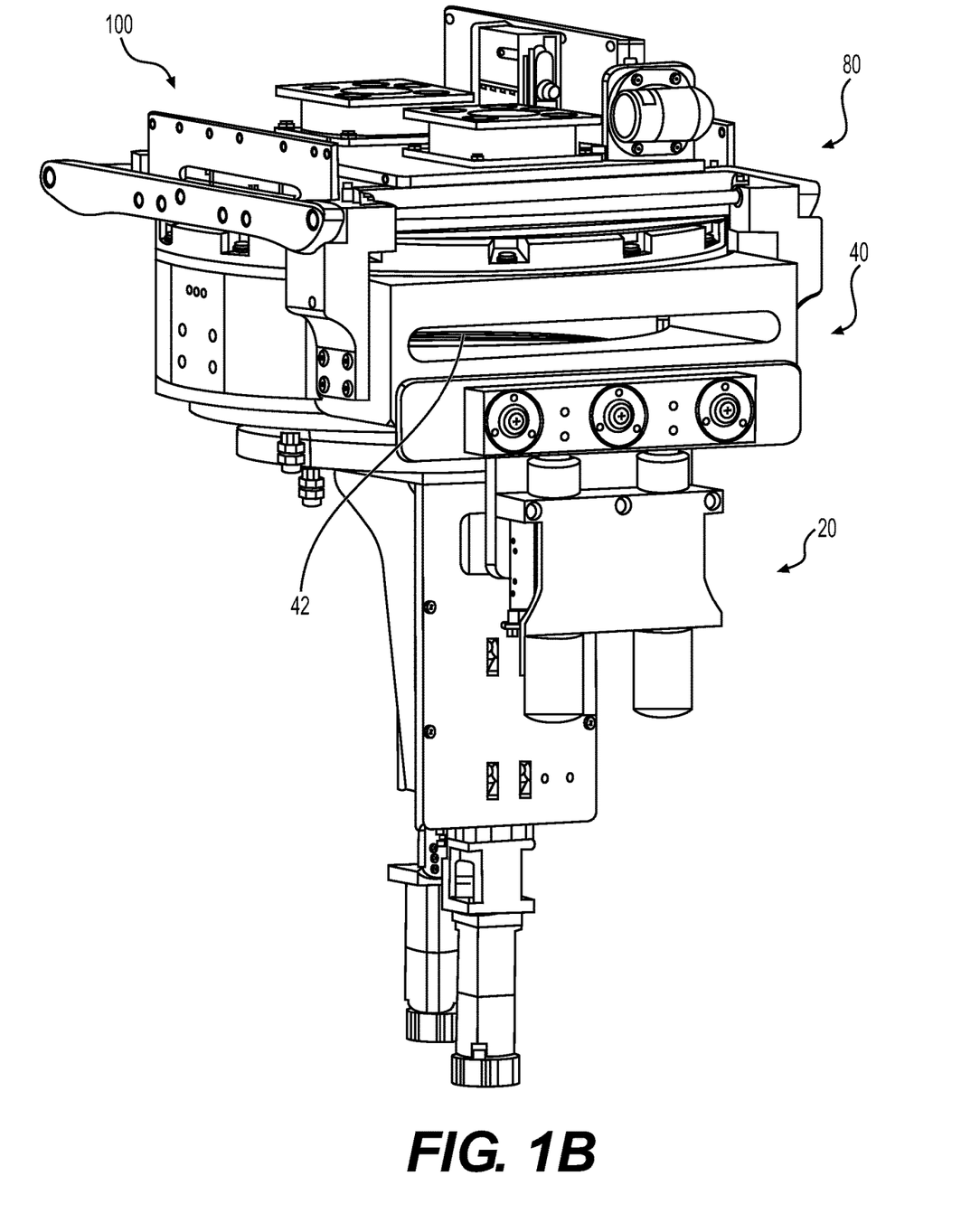
Figure 2:
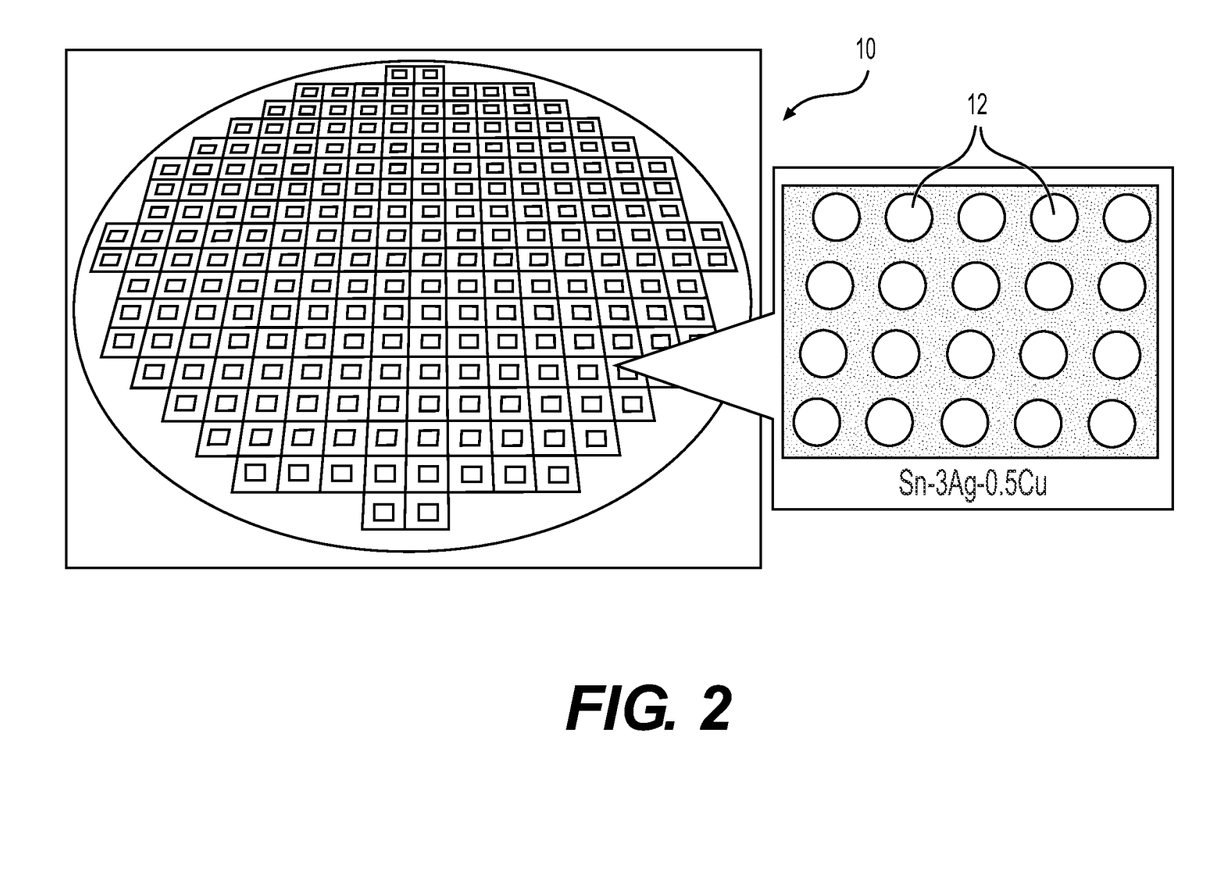
FIG. 2 illustrates an exemplary substrate configured to processed in the processing oven of FIG. 1A.
Figure 3:
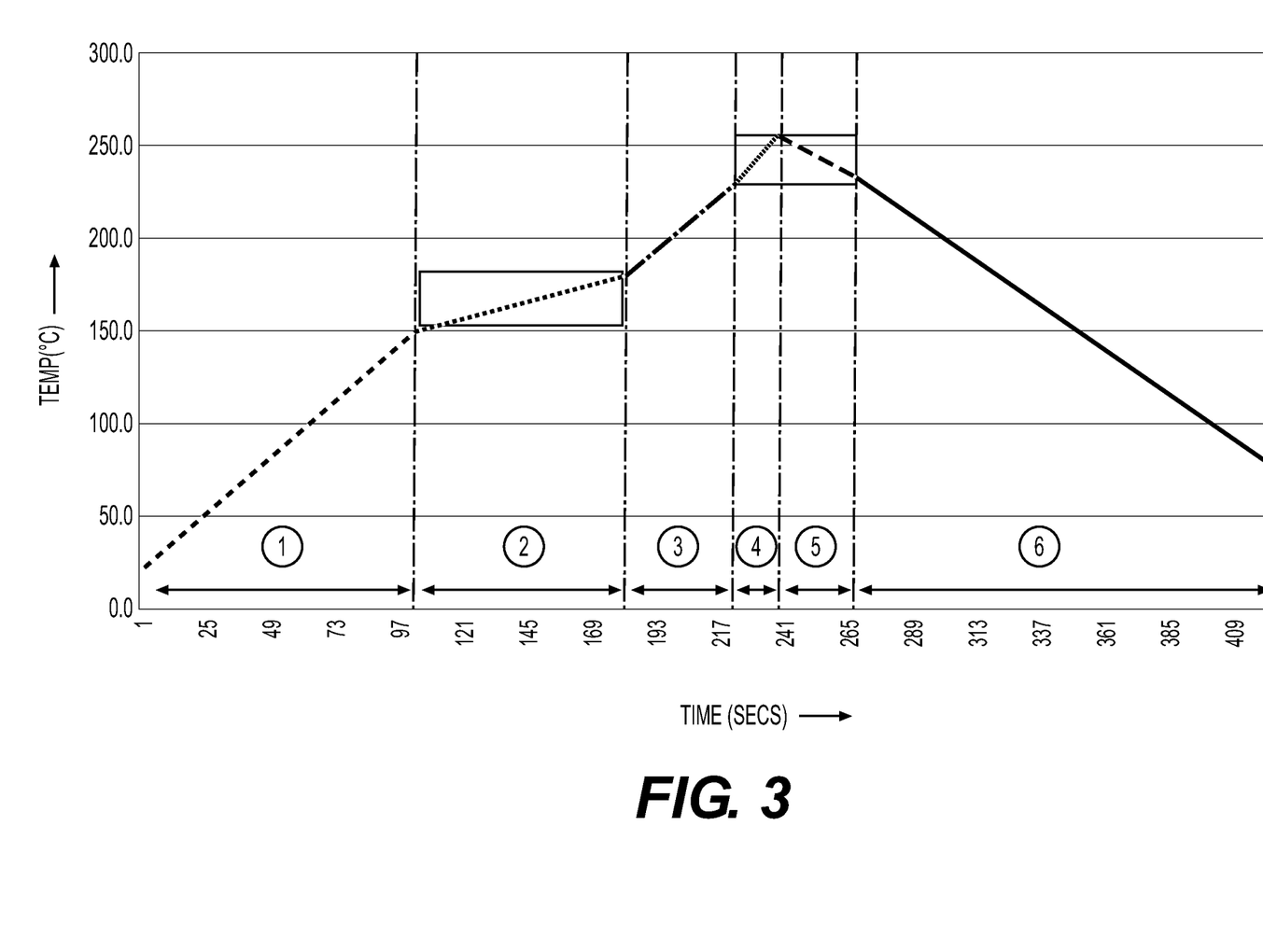
FIG. 3 illustrates an exemplary temperature profile that may be used to process the substrate of FIG. 2.

FIG. 1A is a side view and FIG. 1B is a perspective view of an exemplary solder reflow or processing oven (oven 100) of the current disclosure. In the discussion below, processing oven 100 will be described in terms of its preferred use as a solder reflow oven. However, this use is exemplary and illustrative only, and is not a requirement. Ovens of the current disclosure can be used for any purpose. Oven 100 includes process chamber 40, configured to receive a substrate (e.g., wafer, organic/ceramic substrates, semiconductor packages, printed circuit board (PCB), etc.), and adapted to subject the substrate to a high temperature process. In the discussion below, a semiconductor wafer with solder on its top surface (see FIG. 2) will be described as the substrate that is subject to an exemplary solder reflow process in oven 100. In general, any size (e.g., 200 mm, 300 mm, etc.) of semiconductor wafer may be received in chamber 40. FIG. 2 illustrates an exemplary semiconductor wafer 10 that may be received in chamber 40 and subject to a reflow process. As would be recognized by a person skilled in the art, after integrated circuit processing, wafer 10 includes multiple dies (or IC chips), and solder material may be deposited on the I/O pads of the multiple dies in wafer 10. Prior to dicing the wafer 10 into individual dies, wafer 10 may be subject to a reflow process in oven 100 to form solder bumps 12 thereon (called wafer bumping). Any type of solder material (lead-free solder, lead-tin solder, etc.) may be deposited on wafer 10 and the wafer 10 may be subject to any type of reflow process or reflow profile. Persons having ordinary skill in the art would recognize that reflow process that wafer 10 is subjected to depends on the type of solder material deposited on wafer 10. Suitable reflow profiles for different types of solder materials are available in the published literature and may be obtained from solder vendors. FIG. 3 illustrates an exemplary reflow profile that may be applied to wafer 10 in chamber 40. In FIG. 3, the X-axis shows time in seconds, and the Y-axis shows temperature in degrees Celsius (° C.).

Figure 4:
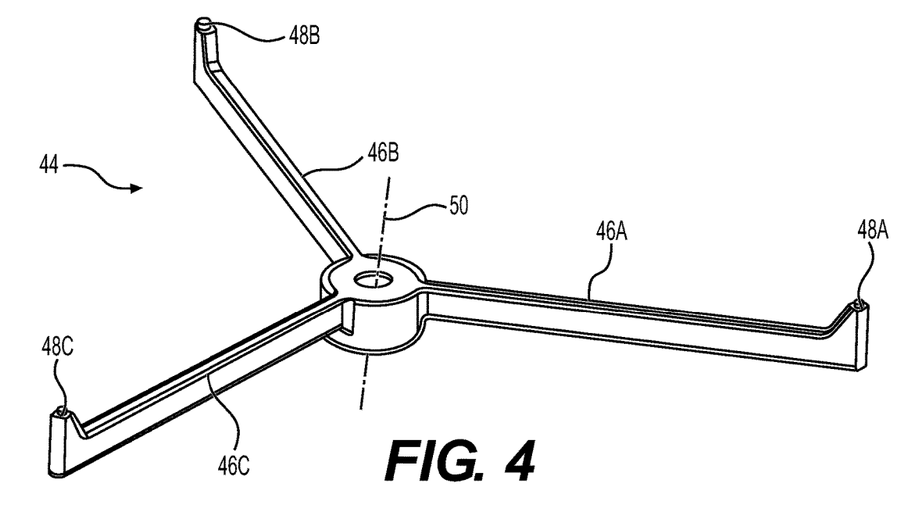
FIG. 4 illustrates a spindle of the processing oven of FIG. 1A.

A robotic manipulator or arm (not shown) may insert wafer 10 into chamber 40 through an inlet port 42. Wafer 10 may be disposed on a rotatable spindle 44 within chamber 40. FIG. 4 illustrates an exemplary spindle 44 positioned in chamber 40 (see FIG. 5B). Spindle 44 may include a plurality of arms 46A, 46B, 46C (e.g., 3 arms) that extend radially outward from a central axis 50. Each arm 46A, 46B, 46C of spindle 44 includes nub 48A, 48B, 48C that projects upwards. Wafer 10 may rest on nubs 48A, 48B, 48C of spindle 44. Oven 100 also includes motor assembly 20, configured to support and control the movement of wafer 10 in chamber 40. Motor assembly 20 may include one or motors configured to rotate spindle 44 (and wafer 10 supported thereon) in chamber 40 about its central axis 50. Spindle 44 may be rotated at any speed. In some embodiments, the rotational speed of spindle 44 may vary between about 0 to 20 RPM. Motor assembly 20 may also include motor to raise and lower rotating wafer along axis 50 between multiple vertically spaced-apart regions or zones within chamber 40. Oven 100 may also include lamp assembly 80 with plurality of lamps 82 (see FIGS. 5B, 5C) configured to heat top surface of wafer 10 in chamber 40.

Figure 5A:
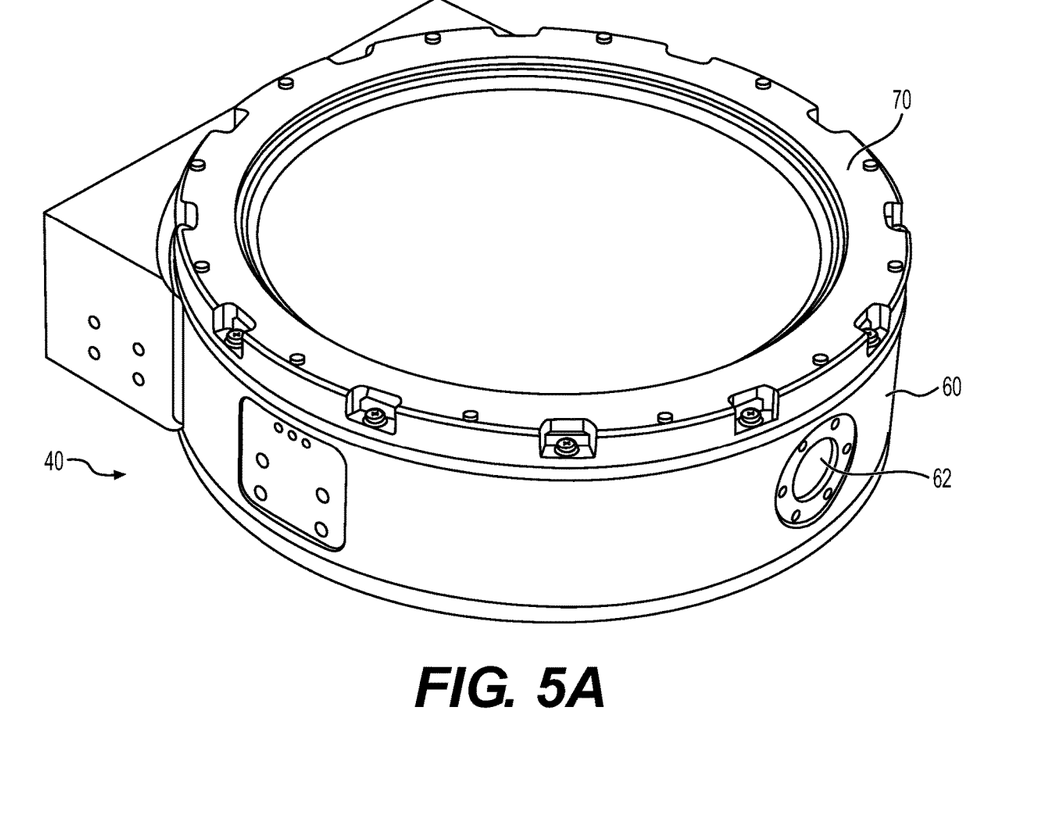
FIGS. 5A and 5B are perspective views of the processing chamber of the processing oven of FIG. 1A.
Figure 5B:
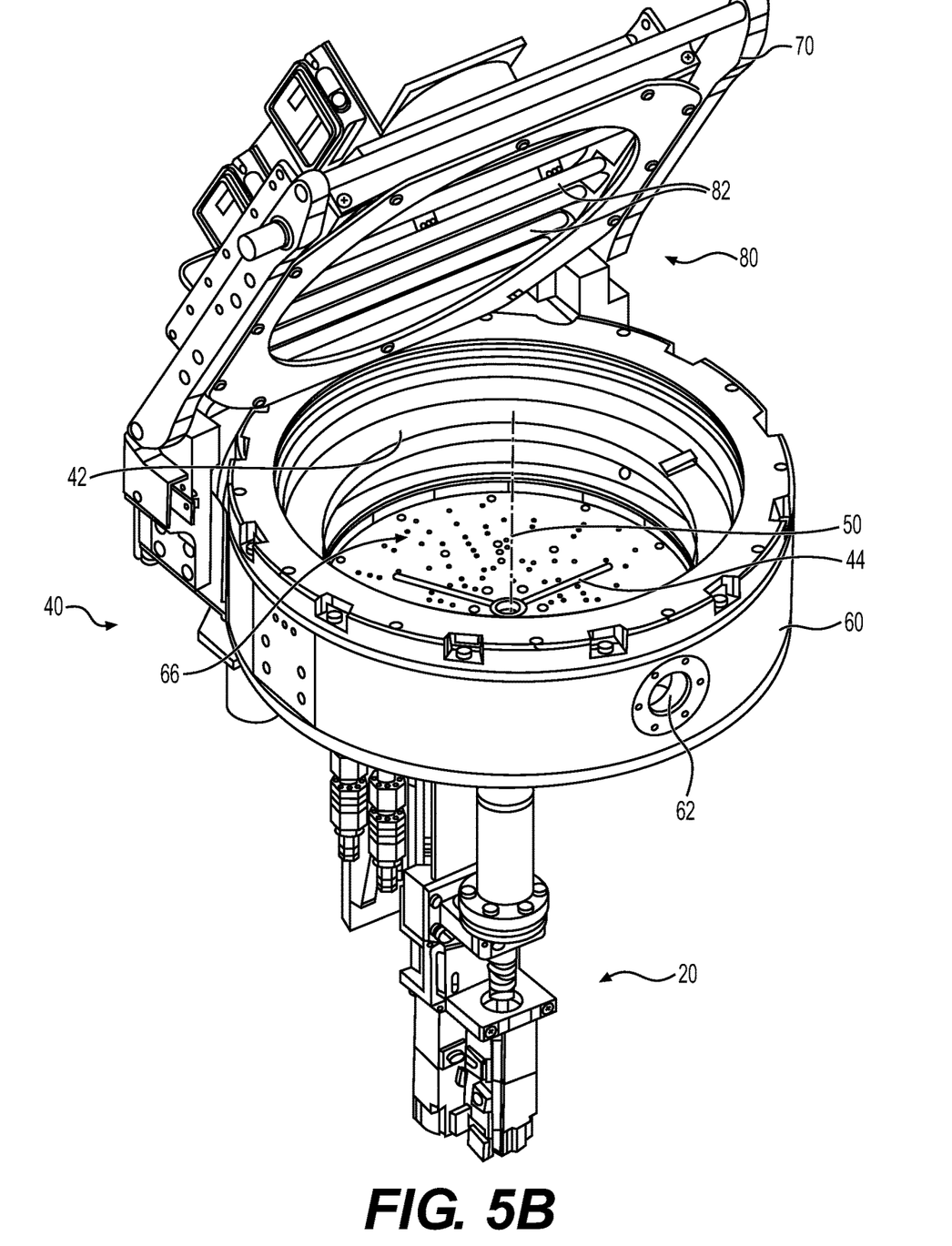

FIGS. 5A and 5B illustrate an exemplary processing chamber 40 of oven 100. As illustrated in these figures, in some embodiments, chamber 40 may have a substantially cylindrical configuration. However, a substantially cylindrical shape is not a requirement. In general, processing chamber 40 can have any shape. In some embodiments, the chamber 40 may be substantially square, substantially rectangular, or have another shape. Oven 100 may gave a hinged lid 70 attached to base 60. Base 60 and lid 70 define an enclosed space or enclosure 66 (see FIG. 5B) configured to receive wafer 10. The size of chamber 40 and enclosure 66 depends upon the application, for example, the size of the wafer that will be processed in chamber 40. In some embodiments, in oven 100 and chamber 40 configured to process 300 mm wafers, enclosure 66 may have a diameter of about 450 mm and a height of about 150 mm. The inlet port 42, through which wafer 10 is inserted into enclosure 66 of chamber 40 may be defined on base 60. In some embodiments, a valve or a flap may seal the opening of inlet port 42 into enclosure 66 such that enclosure 66 can be pumped down to a low pressure. Base 60 may include one or more gas ports 62. In some embodiments, process gas may be directed in enclosure 66 through gas port 62. In some embodiments, vacuum pump may be coupled to gas port 62 to generate a vacuum in enclosure 66.

Figure 5C:
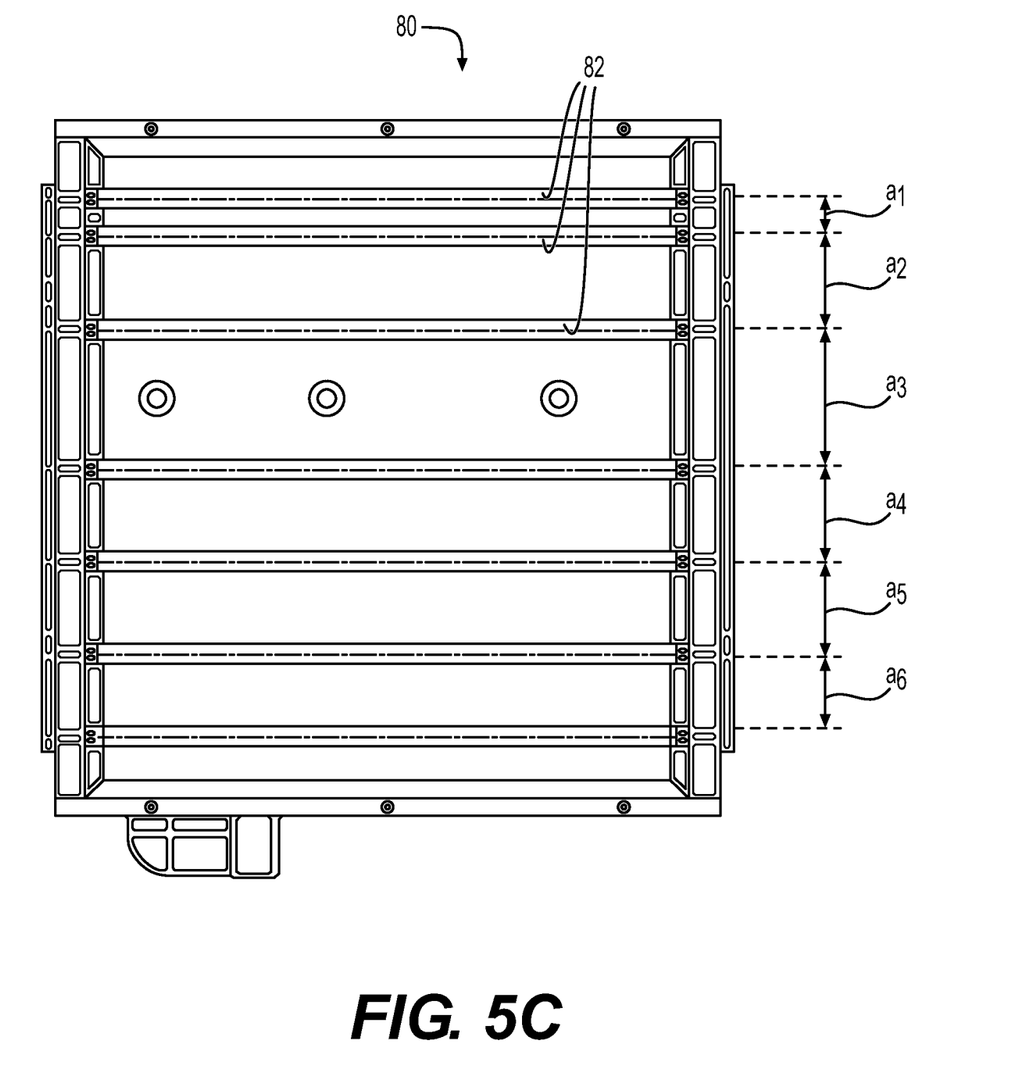
FIG. 5C illustrates an exemplary lamp assembly of the processing oven of FIG. 1A.

In some embodiments, as illustrated in FIG. 5B, lamps 82 of lamp assembly 80 may be disposed on an underside of lid 70 such that, when activated, the lamps 72 heat a top surface of wafer 10 positioned in enclosure 66. FIG. 5C illustrates an exemplary lamp assembly 80 on lid 70. In general, lamp assembly 80 may include any number and any type of lamps 82. In some embodiments, lamp assembly 80 may include 4-10 infrared (IR) lamps 82 having a power between about 1-10 kW for each lamp, or between about 1.5-3 kW (or about 2 kW) for each lamp 82. In some embodiments, as illustrated in FIG. 5C, lamp assembly 80 may include seven halogen lamps 82. The lamps 82 may be arranged (e.g., spaced apart) such that they evenly heat the top surface of the wafer 10 in chamber 40. In some embodiments, as illustrated in FIG. 5C, the lamps 82 may be arranged closer together at the edges (of lamp assembly 80) than at the center. As a result of edge effects, the wafer 10 in the chamber 40 may cool down quicker at the edges than at the center. A smaller relative spacing of the lamps 82 at the edges than at the center may assist in achieving an even temperature distribution on the wafer 10.

The spacing between the lamps 82 of lamp assembly 80 may depend on the application (e.g., size of the wafer and the oven 100). With reference to FIG. 5C, in some embodiments (e.g., in an oven 100 configured to process 300 mm wafers), the spacing between the lamps 82 may be such that $a_1$ is between about 10-30 mm (e.g., about 20 mm), $a_2$ may be between about 40-60 mm (e.g., about 50 mm), $a_3$ may be between about 60-80 mm (e.g., about 75 mm), $a_4$ may be between about 40-60 mm (e.g., about 50 mm), $a_5$ may be between about 40-60 mm (e.g., about 50 mm), and $a_6$ may be between about 40-50 mm (e.g., about 45 mm). It should be noted that the above-described spacing values are only exemplary. In general, the spacing between adjacent lamps 82 at the sides of the lamp assembly 80 may be smaller than that at the center of the lamp assembly 80. In some embodiments, the spacing between adjacent lamps 82 at the sides of the lamp assembly 80 (e.g., $a_1$ or $a_2$ or $a_5$ or $a_6$) may be between about 10-60 mm, and the spacing between adjacent lamps 82 at the center of the lamp assembly 80 (e.g., $a_3$ or $a_4$) may be greater than that at the sides and between about 40-80 mm.

In some embodiments, lamps 82 may be controlled by control system 200 (schematically illustrated in FIG. 1A) of oven 100 to heat the wafer 10 at a selected temperature ramp rate. For example, a different number of lamps 82 may be activated to increase or decrease the ramp rate. Alternatively, or additionally, in some embodiments, the power of lamps 82 may be varied to vary the temperature ramp rate in enclosure 66. In some embodiments, the control system 200 may control the power to the lamps 82 based on the detected temperature in the chamber 40 (e.g., using a feedback loop). For example, when thermocouples (or pyrometers or another temperature detection sensor) in chamber 40 indicate that the temperature of the wafer is below a desired value, the control system 200 may increase the power to the lamps 82. In some embodiments, when the thermocouples indicate that the temperature variation in the wafer is above a threshold value (e.g., temperature at the edges of the wafer is below the temperature at the center, etc.), the control system 200 may vary the power to different lamps 82 in the lamp assembly 80. Although not visible in FIG. 5B, in some embodiments, a window made of a material that is transparent to the wavelength of light emanating from lamps 82 may be provided between base 60 and lid 70 to seal the top of enclosure 66 from the external environment. In such embodiments, the lamps 82 heat the wafer 10 in enclosure 66 through the transparent window. In some embodiments, the window may be made of, for example, quartz, glass, etc.

Figure 6A:
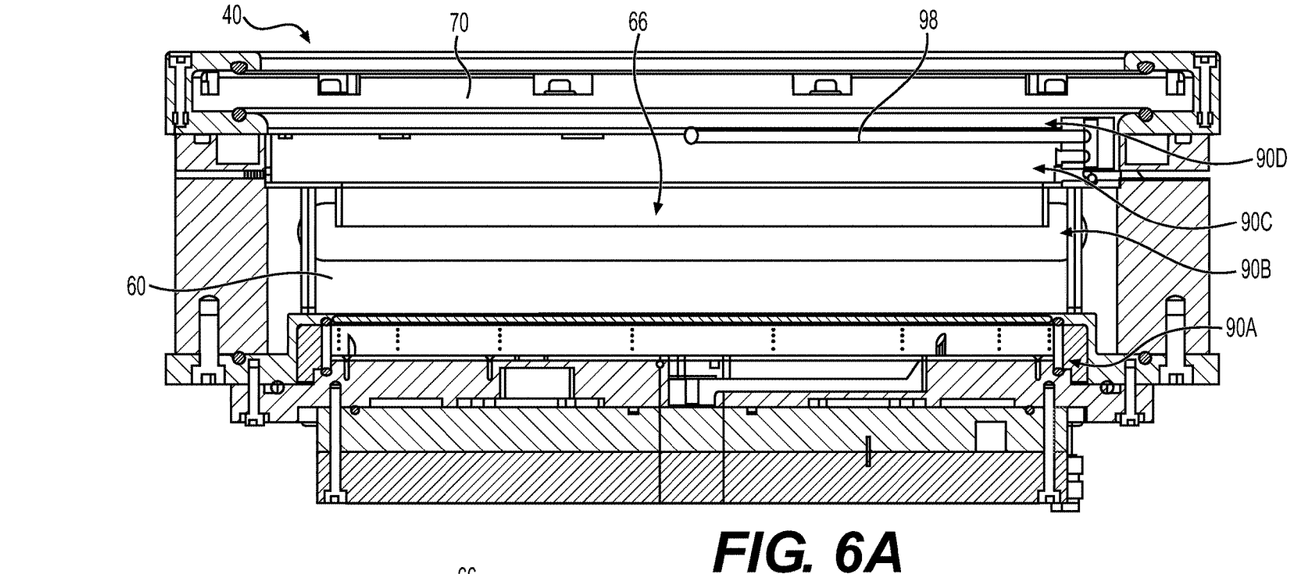
FIGS. 6A and 6B are side views of portions of the processing chamber of FIG. 5A.
Figure 6B:
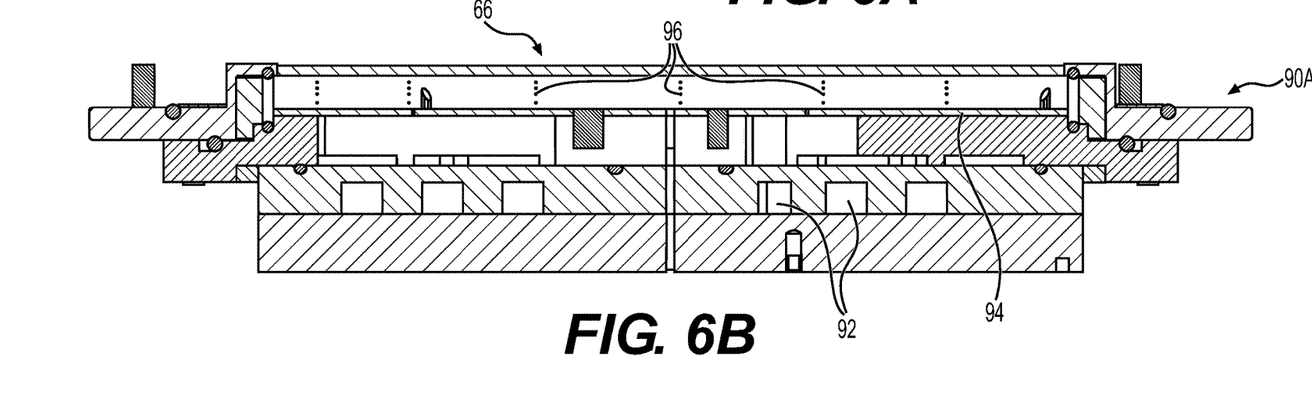

FIG. 6A illustrates a side view of chamber 40. Enclosure 66 of chamber 40 may define a plurality of vertically spaced-apart virtual zones. These zones may include cool-down zone 90A at the base of enclosure 66, transfer zone 90B directly above cool-down zone 90A, dosing zone 90C directly above transfer zone 90B, and fast ramp zone 90D directly above the dosing zone 90C and at the top of enclosure 66. These virtual zones 90A-90D of enclosure 66 are adapted for different functions during reflow processing of wafer 10. During processing, spindle 44 is configured to move (i.e., raise and lower) wafer 10 positioned on nubs 48A-48D (see FIG. 4) between one or more of zones 90A-90D of enclosure 66. FIG. 6B is a side view of cool-down zone 90A of enclosure 66. Cold plate 94 forms the base of enclosure 66. While in cool-down zone 64A, wafer 10 physically sits on (or is positioned near) cold plate 94 to be cooled by conduction. Cold plate 94 includes coolant channels 94 configured to direct a coolant (water or another liquid coolant) therethrough to remove heat conducted from wafer 10. Cold plate 94 also includes plurality of openings 95 (see FIG. 7A) that may be configured to direct an inert gas (e.g., nitrogen) into enclosure 66. In some embodiments, nitrogen may be directed into enclosure 66 via openings 95 to cool underside of wafer 10 by forced convection. A plurality of gas-inlet ports 96 are positioned in cool-down zone 90A to direct inert gas (e.g., nitrogen) into enclosure 66. When wafer is positioned in cool-down zone 90A (e.g., seated on cold plate 94), inert gas (e.g., nitrogen or other suitable inert gas) may be directed into enclosure 66 to flow above wafer 10 and cool top surface of wafer 10 by convention. In some embodiments, gas ports 96 may be disposed on side wall of base 60 (of chamber 40) and positioned such that inert gas from these ports flows over the top surface of wafer 10 seated on cold plate 94. In some embodiments, by combining convective and conductive heat transfer, wafer 10 may be cooled at a rate greater than or equal to (≥) about 60° C./minute. Although not required, in some embodiments, the region from base of enclosure 66 (i.e., top surface of cold plate 94) to a height of about 60 mm from base forms the cool-down zone 90A of enclosure 66. That is, in some embodiments, cool-down zone 90A may be a region of enclosure spanning 0-60 mm from base of enclosure 66.

Transfer zone 90B is a region above cool-down zone 90A aligned with port 42 (see FIGS. 1B and 5B) of chamber 40. As explained previously, wafer 10 is inserted into enclosure 66 via port 42. When wafer 10 is inserted into enclosure 66, it enters enclosure 66 at transfer zone 90B. When wafer 10 is inserted, spindle 44 is positioned in transfer zone 90B such that wafer 10 rests on nubs 48A, 48B, 48C. Although not required, in some embodiments, transfer zone 90B may be a region of enclosure spanning about 60-90 mm from the base of enclosure 66. Dosing zone 90C is a region of the enclosure 66 above transfer zone 90B. When wafer 10 is positioned in dosing zone 90C, chemical vapor (e.g., formic acid vapor) is directed into enclosure 66 via chemical delivery tube 98 positioned proximate the top of enclosure 66. The chemical vapor is injected into enclosure 66 by nozzles on chemical delivery tube 98 while spindle 44 is rotating. The chemical vapor covers the wafer 10 and treats all regions of the wafer 10 substantially uniformly. In some embodiments, an edge ring directs chemical vapor to the top of the wafer. Although not required, in some embodiments, dosing zone 90C is a region of enclosure that spans about 90-120 mm from the base of enclosure 66.

The fast ramp zone 90D is a region of enclosure 66 above the dosing zone 90C. When spindle 44 raises wafer 10 to fast ramp zone 90D, lamps 82 on the underside of lid 70 heat wafer 10. In some embodiments, lamps 82 may heat wafer 10 at a rate ≥about 120° C./minute. Rotation of spindle 44 ensures that all regions of the wafer 10 are heated substantially uniformly. One or more thermocouples and/or pyrometers may measure temperature of wafer 10 during heating. In some embodiments, control system 200 may control power of lamps 82 using a feedback loop (e.g., PID control) to control wafer temperature. In some embodiments, one or more thermocouples may be provided in spindle 44 to measure the temperature of wafer 10 during heating. In some such embodiments, a spring may keep thermocouple(s) in contact with wafer 10. In some embodiments, one or more pyrometers focused on wafer 10 may be disposed at top or bottom of the enclosure 66 to measure the temperature of wafer 10 during heating.

Figure 7A:
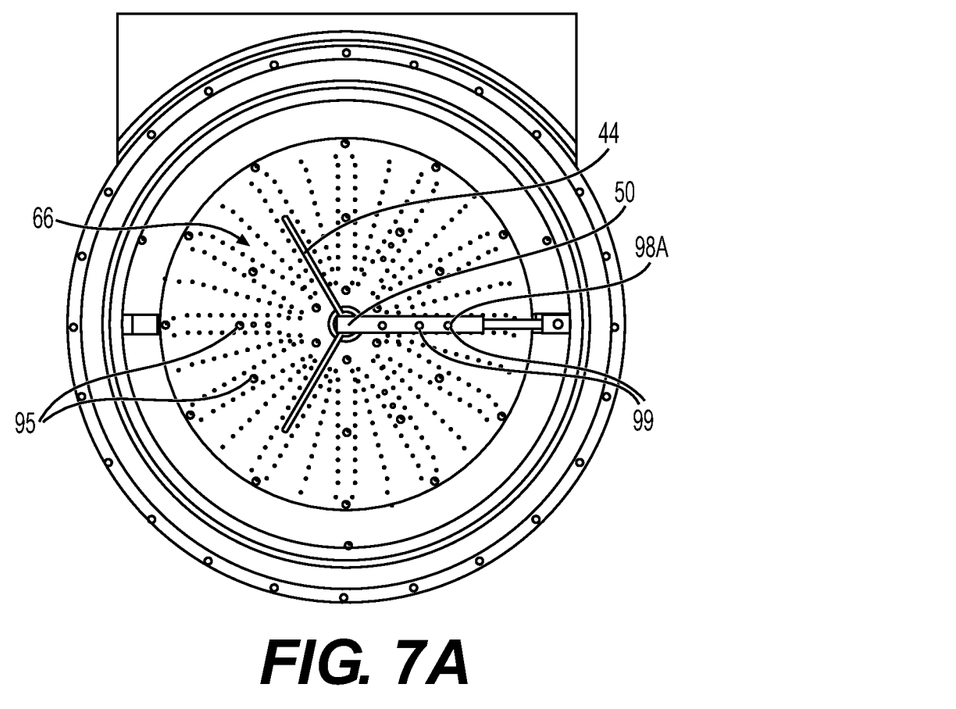
FIGS. 7A-7C are top views of the processing chamber of FIG. 5A in different exemplary embodiments.
Figure 7B:
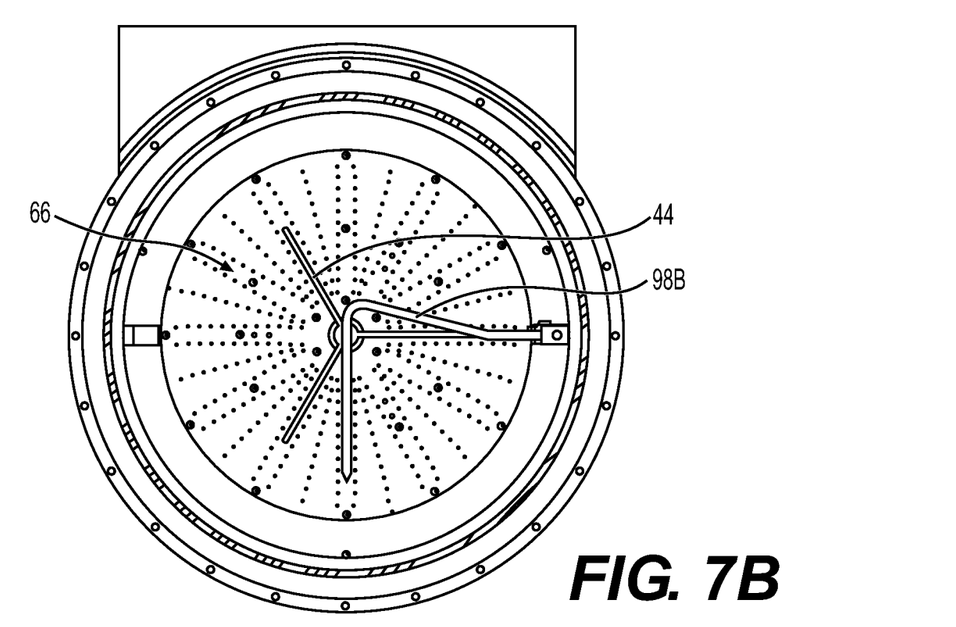
Figure 7C:
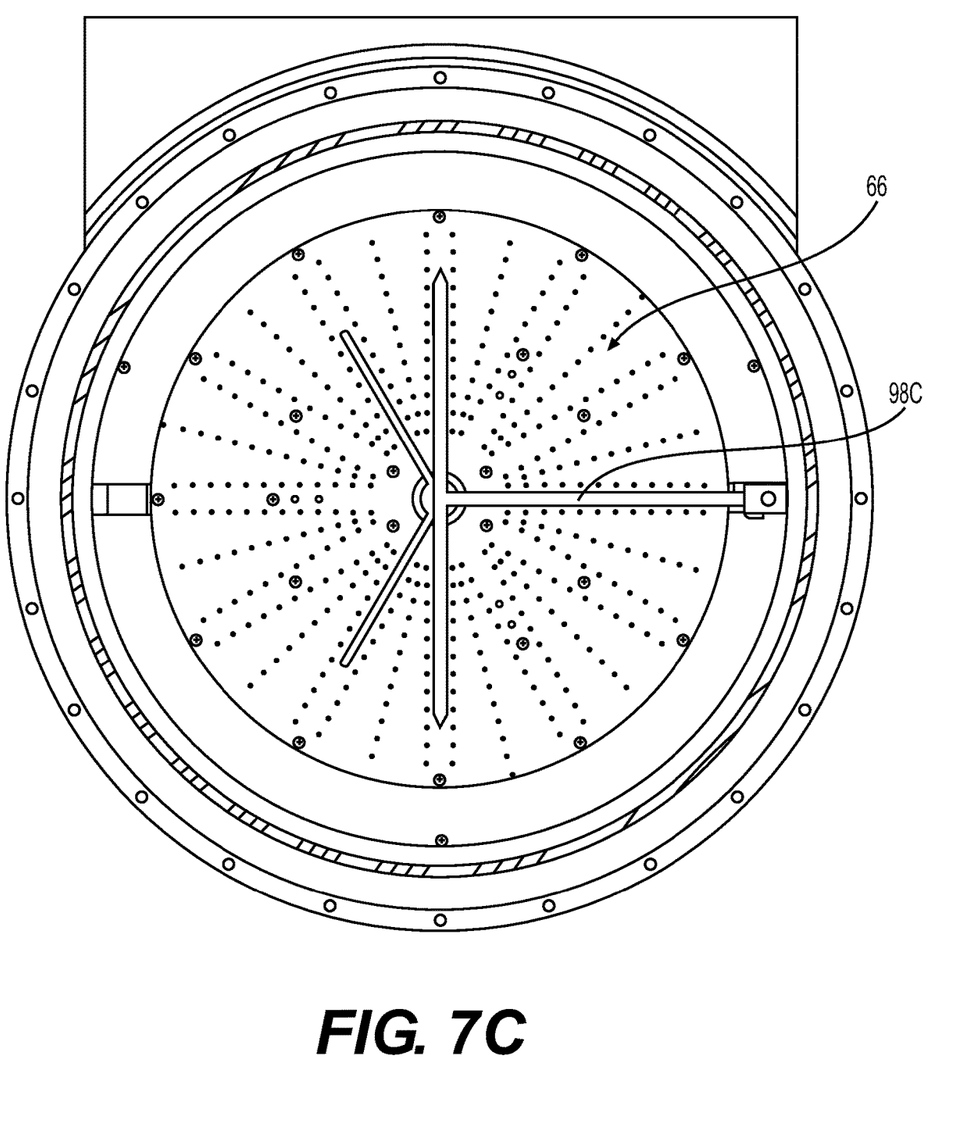

As explained previously, when wafer 10 is positioned in dosing zone 90C, chemical vapor (e.g., formic acid vapor) is injected into enclosure 66 via chemical delivery tube 98 positioned at top of enclosure 66. Chemical delivery tube 98 may have a shape configured to discharge chemical vapor substantially uniformly over the wafer 10. FIGS. 7A-7C illustrate different configurations of chemical delivery tubes 98A-98C that may be used in different embodiments of oven 100. In some embodiments, as illustrated in FIG. 7A, chemical delivery tube 98A may be straight tube that extends from one side of chamber 40 to center of wafer 10. Multiple nozzles 99 or ports may be positioned on underside of tube 98A facing wafer 10. Any number (2-20) of nozzles 99 may be provided on tube 98A. Dispersing gas into enclosure 66 at different radial locations of the rotating wafer 10 assists in treating solder bumps in all areas of wafer 10 substantially uniformly. In some embodiments, as illustrated in FIG. 7B, angled, or bent chemical delivery tube 98B may be used. In some embodiments, as illustrated in FIG. 7C, T-shaped chemical delivery tube 98C may be used.

Although not shown in FIGS. 7B and 7C, spaced apart nozzles 99 may be provided on underside of tubes 98B, 98C facing wafer 10 to uniformly treat all regions of rotating wafer 10. Based on the type, size, and/or shape of wafer 10 being processed, a different configuration of chemical delivery tube 98A, 98B, 98C may be used.

In some embodiments, when the chemical vapor is directed into enclosure 66 via chemical delivery tube 98 at top of wafer 10, inert gas (e.g., nitrogen) may be directed into enclosure 66 at bottom of wafer 10. Inert gas may be introduced into enclosure through openings 95 on cold plate 94 and/or through gas ports 96. Simultaneously directing inert gas under wafer 10 when chemical vapor is directing chemical vapor above wafer 10 allows chemical vapor to cover and treat all regions on top surface of substrate substantially evenly.

An exemplary method 200 of processing a wafer 10 in oven 100 using the exemplary reflow profile of FIG. 3 will now be described. As illustrated in FIG. 3, reflow profile of FIG. 3 is preferably defined by six time-temperature process zones (zones 1-6). A wafer 10 is first loaded into enclosure 66 of chamber 40 through port 42 (step 210). Wafer 10 may be inserted into enclosure 66 via port 42 and disposed on spindle 44 positioned in transfer zone 90B, for example, using robotic arm. Spindle 44 may rotate wafer (step 220) and raise wafer 10 to fast ramp zone 90D of enclosure 66 (step 230). In some embodiments, pressure in enclosure 66 may also be evacuated to a pressure below atmospheric pressure. In some embodiments, enclosure 66 may be pumped down to a pressure between about 100 milliTorr-100 Torr. In some embodiments, the enclosure may be pumped down to a pressure between about 1-10 Torr. Control system 200 activates lamps 82 of lamp assembly 80 to heat wafer 10 and increase its temperature (step 240). In some embodiments, lamps 82 may be turned on before wafer 10 is loaded on spindle 44 in step 210. While in fast ramp zone 90D (i.e., step 230), temperature of wafer 10 may increase as illustrated in zone 1 of FIG. 3.

When thermocouples and/or pyrometers of enclosure 66 indicate that temperature of wafer 10 has reached a target temperature of process zone 1 (about 150° C. in FIG. 3), control system 200 may lower spindle 44 with wafer 10 to dosing zone 90C (step 250). While in dosing zone 90C, chemical vapor (e.g., formic acid vapor) may be directed into enclosure 66 through chemical delivery tube 98 above wafer 10 while simultaneously directing inert gas (e.g., nitrogen) into enclosure 66 through gas-inlet ports 96 (and/or openings 95 on cold plate 94) below wafer 10 (step 260). Inert gas flow below wafer 10 assists in keeping chemical vapor above wafer 10 such that substantially all regions of rotating wafer 10 are evenly exposed and coated with vapor. During this step, temperature of the wafer 10 may follow the path illustrated in zone 2 of FIG. 3. After wafer 10 is coated with chemical vapor in step 260, enclosure 66 may be evacuated using a vacuum pump to remove excess vapor in enclosure 66 (step 270). Alternatively, or additionally, in some embodiments, inert gas (e.g., nitrogen) may be directed into enclosure 66 during this step to exhaust residual chemical vapor that has not been deposited on wafer. Spindle 44 may then raise wafer 10 back to fast ramp zone 90D to continue heating wafer 10 at fast rate (step 280). During this step, temperature of the wafer 10 may follow the profile illustrated in zones 3-5 of FIG. 3 and solder reflows.

After solder reflow is completed, lamps 82 are turned off (or reduced to a safe idle power) by control system 200, and wafer 10 is lowered to the cool-down zone 90A to cool substrate (step 290). In cool-down zone 90A, in some embodiments, wafer 10 may physically rest on cold plate 94 such that bottom surface of wafer 10 is cooled conductively through liquid cooled cold plate 94 and convectively from top via inert (e.g., nitrogen) gas from gas-inlet ports 96 flowing over top of wafer 10. In some embodiments, inert gas (e.g., nitrogen) may also be directed in through openings 95 in cold plate 94 to assist in cooling back side of wafer 10. While in cool-down zone 90A, temperature of wafer 10 may follow profile illustrated in zone 6 of FIG. 3. After cooling is complete, spindle 44 may raise wafer 10 to transfer zone 90B and wafer 10 may be removed from enclosure through port 42 (step 300).

Figure 8:
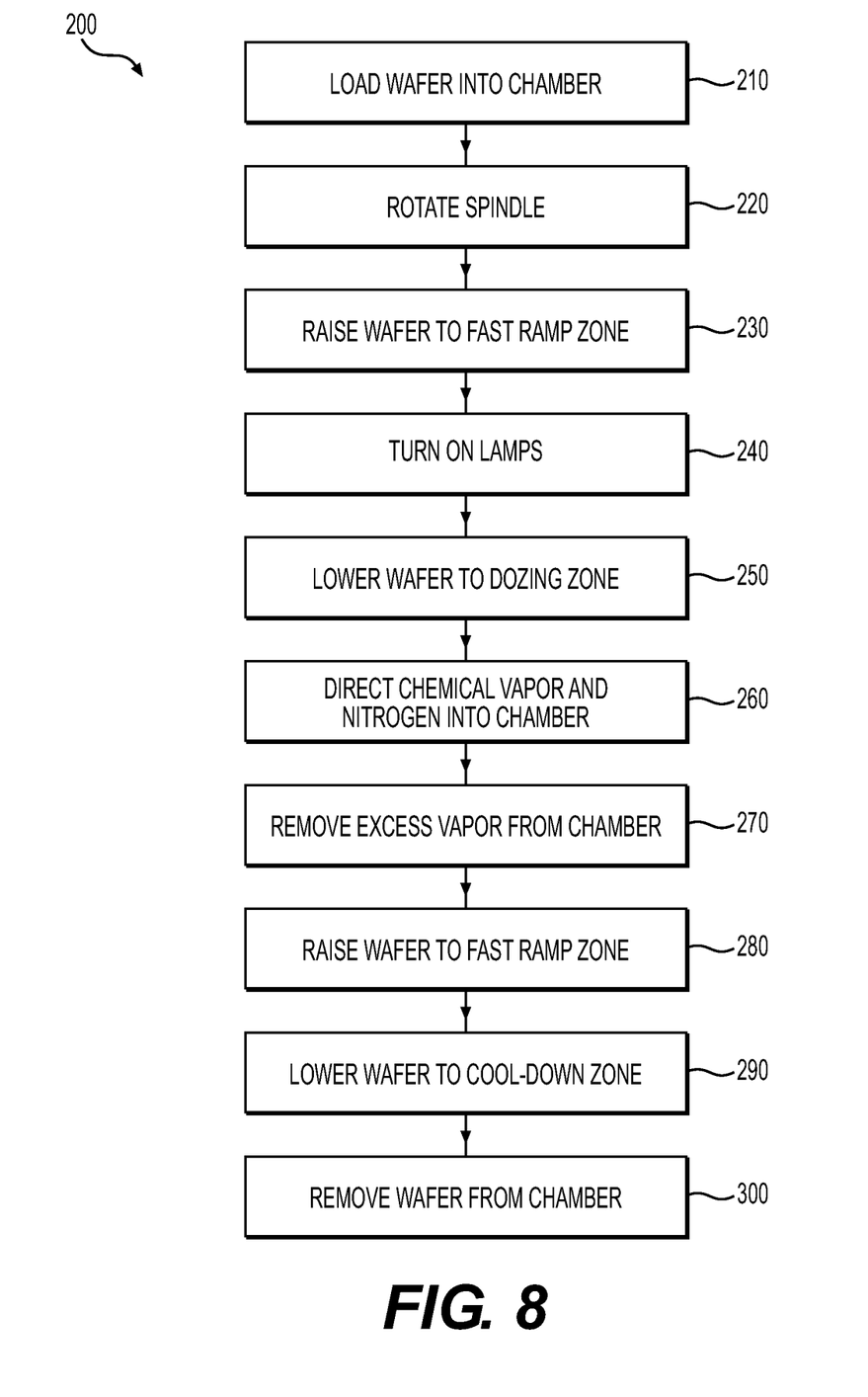
FIG. 8 is a flowchart showing an exemplary method of using the processing oven of FIG. 1A.

The above-described embodiment of reflow oven 100 and method 200 of operating the oven are only exemplary. Many variations are possible. Any reflow process may be performed using oven 100 using a time-temperature profile (or reflow profile) suitable for solder material being used. U.S. patent application Ser. No. 16/851,977, filed on Apr. 17, 2020, and titled Batch Processing Oven and Method, describe some exemplary reflow processes that may be carried performed in oven 100. The disclosures of this '977 application are incorporated herein by reference in their entirety, as if fully set forth herein. As a person skilled in the art would recognize, the steps of method 200 need not be performed in the order illustrated in FIG. 8. Some steps may be omitted and/or some steps added in other exemplary methods. For example, in some embodiments, lamps 82 may be activated (step 240) before loading wafer into the chamber (i.e., step 210) or before rotating spindle (step 220), etc. As another example, in some embodiments, enclosure 66 of chamber 40 may be pumped down to a sub-atmospheric pressure (e.g., between about 1-10 Torr) loading the wafer into chamber (step 210), etc. Persons of ordinary skill in the art would recognize and understand these possible variations to be within the scope of the present disclosure.

Furthermore, although oven 100 is disclosed in conjunction with a solder reflow process, this is only exemplary. A person of ordinary skill in the art would recognize that the oven can be used for any process. Further, although a wafer bumping process is described. In general, any high temperature process may be performed in oven 100 on any type of substrate (e.g., wafer, organic/ceramic substrates, semiconductor packages, printed circuit board (PCB), etc.). For example, in some embodiments, oven 100 may be used for attaching dies (or IC chips) on substrates or chip-carriers (PCB, ceramic/organic substrates, etc.) using solder (e.g., reflow soldering). During reflow soldering, solder balls or solder paste (a sticky mixture of powdered solder and flux) may be used to temporarily attach one or more electronic components together (e.g., dies to substrates using C4 joints, die-substrate assembly to package substrate (e.g., PCB) using ball grid array (BGA) joints, etc.). The component assembly may then be subject to a reflow process to melt the solder and attach the components together. Other embodiments of the oven and related methods will be apparent to those skilled in the art from consideration of the disclosure herein. It should also be noted that, in some embodiments, the functions of one or more of the described zones of the oven 100 (e.g., cool-down zone 90A transfer zone 90B directly above cool-down zone 90A, dosing zone 90C fast ramp zone 90D, etc.) may be combined, thereby reducing the number of zones.

What is claimed is:

1. A processing oven, comprising:
   a processing chamber defining an enclosure, the enclosure including a spindle configured to (a) support a substrate, (b) rotate with the substrate about a central axis of the processing chamber, and (c) move vertically along the central axis to position the substrate at different locations within the enclosure;
a lamp assembly configured to heat a top surface of the substrate supported on the spindle, wherein the lamp assembly includes a plurality of spaced-apart lamps; and
a lift assembly configured to move the spindle along the central axis.

2. The oven of claim 1, wherein a spacing of adjacent lamps of the lamp assembly is smaller at sides of the lamp assembly than at a center of the lamp assembly.

3. The oven of claim 1, wherein the processing chamber further comprises a transparent window that defines a top wall of the enclosure, wherein the lamp assembly is configured to heat the top surface of the substrate through the transparent window.

4. The oven of claim 1, wherein the processing chamber further comprises a cold plate that defines a bottom wall of the enclosure, wherein the cold plate further comprises one or more channels configured to direct a liquid coolant therethrough.

5. The oven of claim 1, wherein the processing chamber further comprises a lid and the lamp assembly is disposed on an underside of the lid.

6. The oven of claim 1, wherein the spindle further comprises one or more thermocouples configured to contact a surface of the substrate.

7. The oven of claim 1, wherein a side wall of the processing chamber further comprises a substrate-inlet port, the substrate-inlet port being configured to direct the substrate into the enclosure.

8. The oven of claim 1, wherein a bottom region of the enclosure further comprises a plurality of gas-inlet ports configured to direct an inert gas into the enclosure and a top region of the enclosure includes a chemical delivery tube configured to direct a chemical vapor into the enclosure.

9. The oven of claim 8, wherein the chemical delivery tube further comprises a plurality of gas nozzles configured to direct the chemical vapor toward the top surface of the substrate.

10. The oven of claim 9, wherein the chemical delivery tube comprises one or more of: (i) a straight tube that extends from a side of the enclosure toward the central axis, (ii) a tube that includes one or more angled portions, or (iii) a T-shaped tube.

11. The oven of claim 1, further comprising a control system configured to control the operation of the lamp assembly using a feedback loop based on a temperature of the substrate.

12. The oven of claim 1, wherein the processing chamber further comprises a vacuum port configured to be coupled to a vacuum pump.

13. A processing oven, comprising:
a processing chamber defining an enclosure, the processing chamber including:
a spindle positioned in the enclosure and configured to (a) support a substrate thereon, (b) rotate along with the substrate about a central axis of the processing chamber, and (c) move vertically along the central axis to position the substrate at different locations within the enclosure;
a cold plate that forms a bottom wall of the enclosure, the cold plate including one or more channels configured to direct a liquid coolant therethrough;
a plurality of gas-inlet ports positioned at a bottom region of the enclosure, the plurality of gas-inlet ports being configured to direct nitrogen gas into the enclosure; and
a chemical delivery tube positioned at a top region of the enclosure, the chemical delivery tube being configured to direct a chemical vapor into the enclosure; and
a lamp assembly configured to heat a top surface of the substrate supported on the spindle, wherein the lamp assembly includes a plurality of spaced-apart lamps, and wherein a spacing of adjacent lamps of the lamp assembly is closer at sides of the lamp assembly than at a center of the lamp assembly;
wherein a spacing of adjacent lamps of the lamp assembly is smaller at sides of the lamp assembly than at a center of the lamp assembly.

14. The oven of claim 13, wherein the chemical delivery tube further comprises a plurality of gas nozzles configured to direct the chemical vapor toward the top surface of the substrate.

15. The oven of claim 13, wherein the processing chamber further comprises a lid and the lamp assembly is disposed on an underside of the lid.

16. The oven of claim 13, wherein the spindle further comprises one or more thermocouples configured to contact a surface of the substrate.

17. The oven of claim 13, wherein a side wall of the processing chamber further comprises a substrate-inlet port, the substrate-inlet port being configured to direct the substrate into the enclosure.

18. A processing oven, comprising:
a processing chamber having a lid, the processing chamber and the lid defining an enclosure;
a substrate-support structure positioned in the enclosure, the substrate-support structure being configured to (a) support a substrate, and (b) rotate with the substrate about a central axis of the processing chamber;
a lamp assembly positioned on an underside of the lid, the lamp assembly being configured to heat a top surface of the substrate positioned in the enclosure, wherein the lamp assembly includes a plurality of lamps spaced apart from each other such that a spacing of adjacent lamps of the lamp assembly is smaller at sides of the lamp assembly than at a center of the lamp assembly; and
a chemical delivery tube positioned in the enclosure, wherein the chemical delivery tube includes a plurality of gas nozzles configured to direct a chemical vapor toward the top surface of the substrate positioned in the enclosure.

19. The oven of claim 18, wherein the processing chamber further comprises a cold plate that defines a bottom wall of the enclosure, wherein the cold plate comprises one or more channels configured to direct a liquid coolant therethrough.

20. The oven of claim 18, wherein the spacing between adjacent lamps at the sides of the lamp assembly 80 is between about 10-60 mm and the spacing between adjacent lamps at the center of the lamp assembly is between about 40-80 mm.

21. The oven of claim 20, wherein the plurality of gas nozzles of the chemical delivery tube is configured to direct formic acid vapor toward the top surface of the substrate positioned in the enclosure.

22. The oven of claim 18, wherein the processing chamber includes a plurality of gas-inlet ports configured to direct an inert gas into the enclosure below the substrate positioned in the enclosure.

* * * * *